United States Patent [19]

Razon et al.

[11] 4,437,604
[45] Mar. 20, 1984

[54] METHOD OF MAKING FINE WIRE INTERCONNECTIONS

[75] Inventors: Ely Razon, Hatboro; Dan Vilenski, Horsham, both of Pa.

[73] Assignee: Kulicke & Soffa Industries, Inc., Horsham, Pa.

[21] Appl. No.: 358,336

[22] Filed: Mar. 15, 1982

[51] Int. Cl.³ .................... B23K 20/10; B23K 20/00
[52] U.S. Cl. ................................................. 228/179
[58] Field of Search .................. 228/4.5, 179, 110

[56] References Cited

U.S. PATENT DOCUMENTS

| | | | |
|---|---|---|---|
| 3,444,612 | 5/1969 | Pennings | 228/4.5 |
| 3,460,238 | 8/1969 | Christy | 228/111 |
| 3,623,649 | 11/1971 | Keisling | 228/4.5 |
| 3,643,321 | 2/1972 | Field | 228/4.5 |
| 4,230,925 | 10/1980 | Lascelles | 228/4.5 |
| 4,340,166 | 7/1982 | Bilane | 228/179 |

*Primary Examiner*—Nicholas P. Godici
*Assistant Examiner*—Marc Hodak
*Attorney, Agent, or Firm*—John B. Sowell

[57] ABSTRACT

The present invention teaches a novel method of making ultrasonic fine wire interconnections between pads on a semiconductor chip and lead out terminals which may be performed with commercially available computer controlled automatic wire bonding machines having an ultrasonic bonding tool holder. A capillary wedge bonding tool is employed which has an annular working face similar in cross-section to a conventional narrow face bonding wedge. When the second bond of an interconnecting wire is made, the capillary wedge bonding tool is moved away from the second bond to leave a small portion of the wire exposed out of the capillary wedge bonding tool. The wire is clamped and the bonding tool is then moved in a predetermined direction away from the second bond to break the wire and form a wire bonding tail. The predetermined direction of movement is at an angle which properly aligns the wire bonding tail in an angular direction under the annular working face of the capillary wedge bonding tool without the necessity of rotating the wedge bonding tool relative to the semiconductor chip.

4 Claims, 9 Drawing Figures

METHOD OF MAKING FINE WIRE INTERCONNECTIONS

BACKGROUND OF THE INVENTION

1. Related Applications and Patents

This invention is related to our application Ser. No. 244,099 filed Jan. 12, 1981 for "A Method of Making Constant Bonding Wire Tail Lengths".

2. Field of the Invention

The present invention is related to fine wire bonding and the operation of high speed automatic wire bonding machines. More particularly, the present invention is related to a novel method of making the bent end of the fine wire at the second bond in a direction which is optimized and oriented under the working face of a capillary fine wire bonding tool in preparation for a new first bond.

3. Description of the Prior Art

Fine wires of gold and aluminum are employed in wire bonding machines to make electrical interconnections between two or more electrodes on semiconductor devices. The most common wire interconnection made on a semiconductor is made between the conductive pad on a semiconductor chip and a conductive terminal which is adjacent the chip and which serves as an output lead to the connector pins of the package in which the semiconductor chip is contained.

Integrated circuit chips that have large numbers of pads must be connected to the lead out terminals that are arranged in some irregular pattern closely adjacent the outer perimeter of the semiconductor chip. When making the fine wire interconnections, it is a preferred practice to make the first bond on the very small conductive pad on the semiconductor chip. After forming a loop with the fine wire, a second bond is made on the conductive terminal. The fine wire is then severed by tearing or breaking the fine wire at the second bond. When the automatic wire bonder is a ball bonder, the wire is pulled vertically upward to sever it at the second bond and leave the wire unbent so it may be extended from the capillary bonding tool a predetermined length. The predetermined length of fine wire extending vertically from the capillary bonding tool is then heated by a hot gas such as hydrogen which causes the fine wire to make a ball on the end of the wire. This ball is then ball bonded to the next conductive pad on the semiconductor chip to be bonded and the next interconnection is made. Automatic ball bonders, such as that shown and described in U.S. Pat. No. 4,266,710 are provided with moveable X-Y tables and a bonding head which is pivoted from the main frame of the bonding machine.

When the fine wire interconnection is being made by an automatic wedge bonder such as that shown in U.S. Pat. No. 4,239,144, the wire is severed at the second bond by pulling the wire horizontally and vertically to break the wire at the second bond and leave the fine wire tail bent and oriented under the working face of the wedge bonding tool. The automatic wire bonder shown in U.S. Pat. No. 4,239,144 is provided with a rotary head and may be employed to perform the method set forth in our co-pending application Ser. No. 244,099.

Heretofore, wedge bonding tools have been provided with very narrow working faces. Heretofore, when such bonding wedges are employed to make a last bond (second bond), the bonding wedge preferably continues away from the last bond in a direction which is substantially aligned with the direction of the wire interconnection. This assures that the fine wire will be oriented under the narrow working face of the bonding wedge after it is broken. Once the tail or bent end of the fine wire is oriented under the bonding wedge, either the bonding wedge or the mechanism which supports the semiconductor being bonded must be rotated to align the wire bonding tail for the next bond. The chip may be mounted on a rotary platform or the bonding head may be mounted on a rotary head supporting frame as shown in U.S. Pat. No. 4,239,144.

If the rotary direction of movement mechanism is eliminated from such wedge bonding machines, they may be made cheaper and operated faster.

For reasons of both economy and speed of operation, semiconductor chips are being made smaller and the pads on such integrated circuits are being made smaller. Automatic wire bonders are employing smaller fine wires and are attempting to orient the tail or bent end of the fine wire under the working face of a wedge bonding tool so that it can exactly locate the small conductive pads on such integrated circuits. It has been found that the bonding wire tail under a wedge bonding tool has a tendency to miss the conductive pad on said semiconductors. Most high volume semiconductor chips are being wire bonded by computer controlled automatic wire bonders such as the Models 1418-1419 and 1470 made by Kulicke and Soffa Industries, Inc. of Horsham, Pa.

It has been a preferred practice to employ fine wire wedge bonding tools with a narrow face when making fine wire interconnections with aluminum wire. Aluminum ball bonding machines are commercially available, however, there are numerous problems which result from attempting to ball bond aluminum wires which present problems heretofore unsolved.

It would be desirable to provide a method of wedge bonding which would allow the use of aluminum wires to make interconnections and which would not require a rotary head or rotary substrate support for making such aluminum fine wire interconnections. Further, it would be desirable that the method of making aluminum fine wire interconnections would be applicable to gold wires so that one automatic bonding machine could be used for making both aluminum and gold fine wire interconnections.

SUMMARY OF THE INVENTION

It is a primary object of the present invention to provide a method of making aluminum fine wire interconnections employing a wedge bonding machine without the requirement of a rotary bonding tool head or a rotary semiconductor chip support.

It is another primary object of the present invention to provide a method of making aluminum or gold fine wire interconnections employing commercially available programmable computer controlled automatic wire bonders.

It is yet another object of the present invention to provide a method of making fine wire interconnections with capillary wedge bonding tools employing programmable computer controlled ball-bonding-type automatic wire bonders having a programmable X-Y table and no rotary movement.

It is yet another object of the present invention to provide a method of wedge bonding which is inherently faster and cheaper because no rotary movement of the bonding wedge is required relative to the semiconductor chip.

In accordance with these and other objects of the present invention to be described in detail hereinafter, there is provided a method of making uniform fine wire interconnections employing a capillary wedge bonding tool of the type having an annular working face with the end of the fine wire bent under the working face of the bonding tool for making the first bond. After the first bond is made on the conductive pad of the semiconductor chip and the bonding tool is moved to the first conductive terminal making a fine wire loop interconnection therebetween, a second wire bond is made. The wire clamp is released and the bonding tool is moved vertically and horizontally away from the second bond to pay out a bent end of fine wire under the working face of the capillary wedge bonding tool. The fine wire is again clamped and the bonding tool is moved away from the second bond so as to break the wire under the working face of the capillary wedge bonding tool. The direction in which the capillary wedge bonding tool is moved in order to break the fine wire and make the bonding wire tail under the working face of the bonding tool is determined by the actual direction of the next fine wire interconnection to be made.

DESCRIPTION OF THE PREFERRED EMBODIMENT

Figure 1:
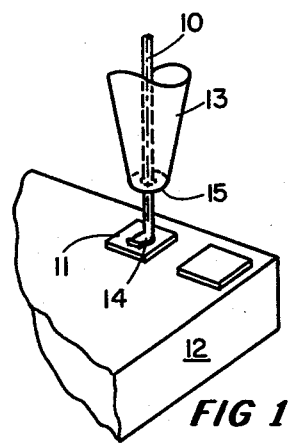
FIG. 1 is an isometric view of a capillary wedge bonding tool after having made a first bond with a fine wire on a conductive pad of a semiconductor chip.
Figure 2A:
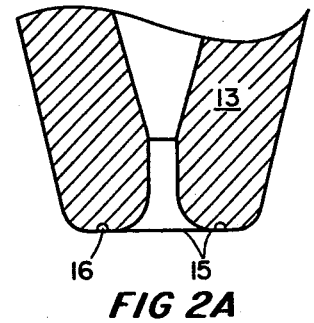
FIG. 2A is an enlarged partial cross-section in elevation of a preferred embodiment capillary wedge bonding tool of the type having an annular working face.

FIG. 1 shows a fine wire 10 of aluminum or gold which has been bonded to a conductive pad 11 on a semiconductor chip 12. When ultrasonic energy and pressure is applied to the capillary wedge bonding tool 13, the bent end or bonding tail 14 is ultrasonically scrubbed on the conductive pad 11 creating heat due to friction energy. The bonding tail 14 is mashed by the bonding force as the wire 11 is molecularly bonded to pad 11. An enlarged end of a preferred embodiment capillary wedge bonding tool is shown in FIG. 2A. The annular working face 15 of the wedge bonding tool 13 is annular in shape and is preferably provided with an annular groove 16 to assist in securing a firm grip on wire 10 to assure a scrubbing action of the fine wire 10.

Figure 2B:
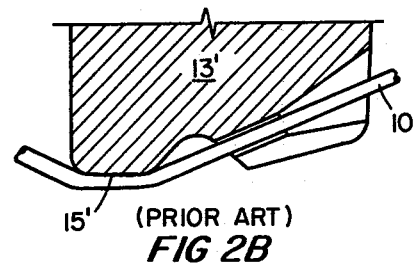
FIG. 2B is an enlarged partial cross-section in elevation of a prior art type narrow working face bonding wedge.

Refer to FIG. 2B showing a prior art narrow face wedge bonding tool 13'. The working face 15' of the narrow face bonding wedge 13' is shaped similar in cross-section to a segment of the annular working face 15 of the bonding tool 13. It will be noted that regardless of the direction in which tool 13 may move, the fine wire 10 will always be under a portion of the working face 15, however, when the prior art wedge bonding tool 13' is employed, the tool must be oriented so that the narrow rectangular working face 15' of the tool 13' comes down centered over the wire 10. The working faces 15 and 15' of the tools 13 and 13' are not the same shape as bonding tools used for ball bonding.

When prior art bonding machines are fitted with narrow face bonding wedges like 13', either the bonding tool holder (not shown) was mounted for rotary movement or the work piece holder (not shown) was mounted for rotary movement. Rotary motion of the bonding wedge 13' relative to the chip 12 will permit the bonding wedge 13' to be aligned in the same direction as the next fine wire interconnection to be made.

Figure 3:
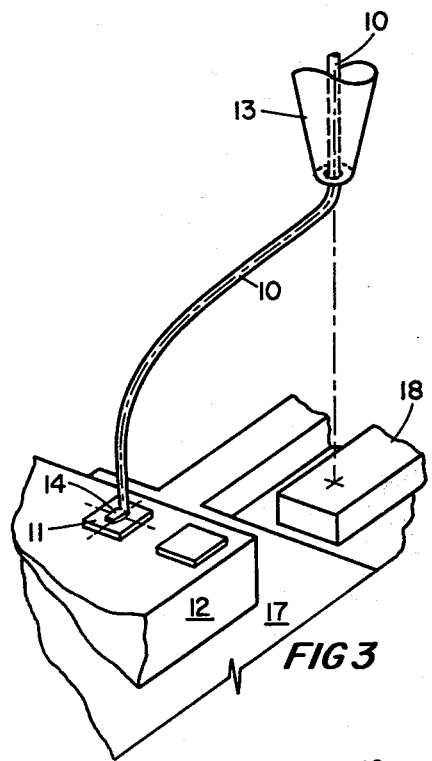
FIG. 3 is an isometric view of a capillary wedge bonding tool after having been moved relative to the first bond to a position for initiating a second bond.

FIG. 3 shows a capillary wedge bonding tool 13 after it has been raised vertically and after the X-Y table 17 has moved to the left causing the wire 10 to be fed out of the capillary bonding tool 13 to form a length of wire which will become the fine wire interconnection. Capillary bonding tool 13 is located approximately over a conductive terminal 18 which usually forms a lead out conductor which connects to a pin connection (not shown) of the integrated circuit package. Conductive terminal 18 may be part of an electrical interconnection on a hybrid substrate or may be a conductive lead.

Figure 4:
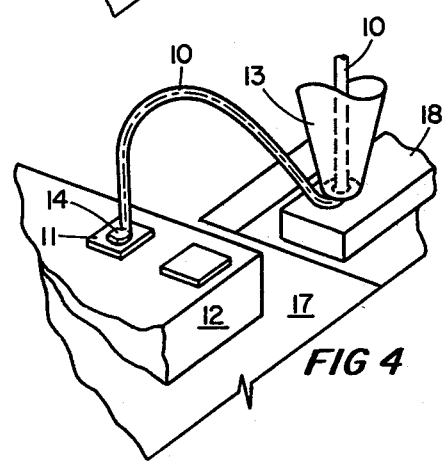
FIG. 4 is an isometric view of a capillary wedge bonding tool at the second bond position.

FIG. 4 shows a capillary wedge bonding tool 13 at the second bond position. Interconnecting fine wire 10 is axially aligned between conductive pad 11 and conductive terminal 18 even though formed as an arcuate loop. The second bond is made by applying a downwardly directed force simultaneously with the application of ultrasonic energy to wedge bonding tool 13. When heat is applied to the chip 12 or to the bonding tool 13, the process is referred to as thermosonic wire bonding. The process without heat is referred to as ultrasonic bonding. Both processes have been applied to both aluminum and gold wires. The addition of heat reduces the bonding forces required to make the bond and/or increases the speed of making the first and second bonds.

Figure 5:
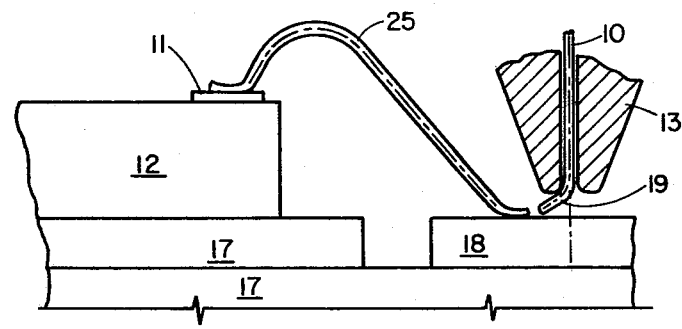
FIG. 5 is a side elevation showing a capillary wedge bonding tool at the point where the bonding wire tail is being made by breaking the wire at the second bond.

FIG. 5 is a side view of the fine wire interconnection made between conductive pad 11 and conductive terminal 18. The capillary wedge bonding tool 13 has been moved vertically and horizontally a short distance before the wire 10 is clamped by a wire clamp (not shown). After the wire 10 is clamped, the X-Y table 17 is moved in a predetermined direction which both bends the wire under the working face 15 of the tool 13 and orients the bent end or tail 19 in the proper direction for the next first bond. There are three distinct ways which may be employed to break the tail 19 from the second bond. The preferred method is to rise vertically from the second bond, then move horizontally away from the second bond, pause and clamp the wire 10 and then continue in the same direction to break the wire 10 at the second bond leaving the tail 19 oriented in a predetermined direction.

A second method is similar to the first method but the first vertical rise is extended further than is required to make the tail 19. Then after moving horizontally away from the second bond, it is now necessary to lower the bonding tool 13 and force part of wire 10 back into the capillary tool before clamping the wire and making the bonding wire tail 19.

A third method is to move the bonding tool 13 vertically while simultaneously moving the X-Y table 17 to a point where the desired tail length 19 is extended from the tool 13. The wire 10 is then clamped and the X-Y table 17 is moved in a predetermined direction to cause the tail 19 to be properly oriented under the working face of the capillary wedge bonding tool 13 as the wire is broken.

Figure 6:
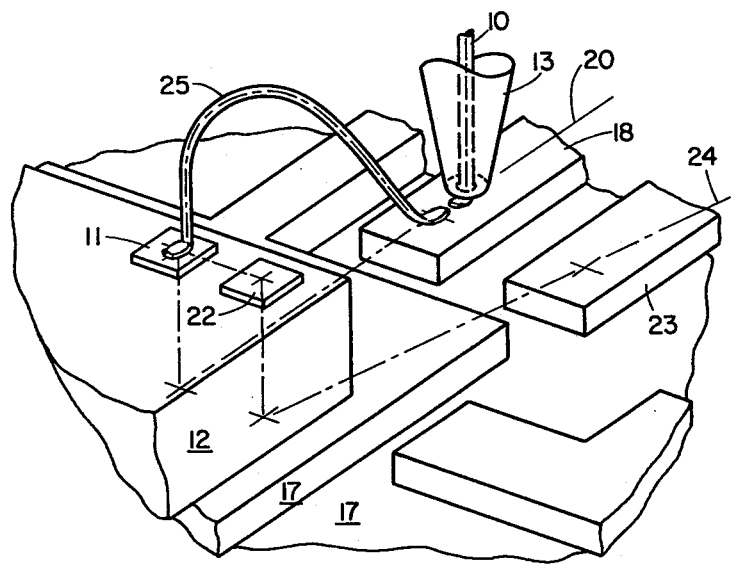
FIG. 6 is an isometric view of a capillary wedge bonding tool at the point where the bonding wire tail is made and showing the annular direction of the first fine wire interconnection and the angular direction path of the next fine wire interconnection to be made.
Figure 7:
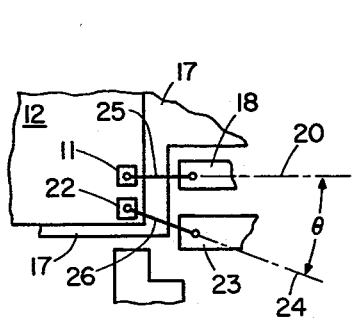
FIG. 7 is a schematic plan view showing the orientation of the adjacent fine wire interconnections shown in FIG. 6.

Refer now to FIGS. 6 and 7. When the first fine wire interconnection is made between the conductive pad 11 and conductive terminal 18, wire 11 is axially aligned therebetween in the angular direction shown by line 20. The next fine wire interconnection to be made is between conductive pad 22 and conductive terminal 23 and the axial alignment therebetween has a different angular direction shown by the line 24. When moving from the first bond to the second bond, the angular direction is preferably determined by an initial teaching or learning process and is stored in the memory of the computer control wire bonder with the first and second bond positions. Since the pads on the chip are preferably bonded manually to learn to bond positions, the determination of the angular direction is a mere arithmetic computation accomplished by software using the positions stored in the memory of the computer.

Alternatively, the chip and the conductive terminals may be drawn in a very large scale drawing and the angular directions physically measure and entered into the memory of the computer. In either event, the angular direction of the fine wire interconnections being made between the pads and the terminals is known and may be determined from looking the data up in the memory of the computer.

Refer now to FIG. 7 which is a schematic plan view of the conductive pads 11 and 22 on chip 12 and the conductive terminals 18 and 23 which are located along the side of chip 12. The fine wire interconnection 25 is shown axially aligned between the first and second bonds on pad 11 and terminal 18 respectively. In order to properly orient the tail 19 in the axial direction of the next fine wire interconnection 26, the X-Y table is moved in a predetermined direction which is substantially equal to the angular direction of the interconnection 26 shown at line 24.

There are two primary things to be considered when determining the actual angular direction of tearing. The least amount of stress is applied on the second bond when the capillary bonding wedge continues in the same direction as the interconnection 25 just completed. However, the wire bonding tail 19 should be oriented in the direction which is aligned with the next interconnection 26 to be made. Between the angles $\theta$ of 15 and 60 degrees, the tear angle may be made up to 15 degrees less than the direction of the next fine wire interconnection 26 without placing undue strain on the second bond. Between the angles of 60 and 90 degrees, the angle of tear may be reduced to one half of the angle $\theta$ shown. Thus, the actual tear angle will never be greater than 45 degrees. If the geometry of the semiconductor chip is large enough and the shape of the conductive pads 11 are properly oriented, there will be no problem with the modified direction of the wire bonding tail 19 when making the next first bond.

Figure 8:
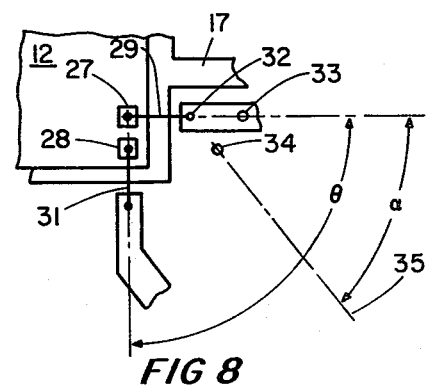
FIG. 8 is a schematic plan view of two adjacent fine wire interconnections that have an included angle greater than 60 degrees.

Refer now to FIG. 8 showing a schematic plan view of conductive pads 27 and 28 on chip 12. The included angle $\theta$ between the alignment directions of the first fine wire interconnection 29 and the next wire interconnection 31 is shown as 90 degrees. There are semiconductor chips which only have pads on two opposite sides of the chip, thus, if the wire bonder is proceeding clockwise around the chip making bonds, the included angle can be greater than 90 degrees or even 180 degrees. To properly align the wire bonding tail 19 for the next first bond on conductive pad 28, a modified procedure is preferably followed. After making second bond 32 on conductive terminal 33, the bonding tool 13 is preferably moved to the left or in the three o'clock direction and in an axial alignment direction away from the first interconnection 29 to break the wire and form the wire bonding tail 19. The bonding tool 13 is now moved to an open or unused metalized spot near the second bond 32 where a dummy second bond 34 (third bond) is made. The bonding tool 13 is now moved in the six o'clock direction which is the same axial direction as the next fine wire interconnection 31. While excessive strain may be placed on the dummy second bond 34, it is not used as an electrical interconnection and is so small that it causes no problems.

In FIG. 8, the speed of operation of wire bonding can be increased slightly by breaking the bent end of wire to form the wire bonding tail 19 while moving along the path 35 shown at the included angle $\alpha$. The angle $\alpha$ can be between 15 and 60 degrees previously described with reference to FIGS. 6 and 7. By moving in the direction closer to the next first bond on conductive pad 28, the speed of operation is increased.

If there is an available spot near the second bond 32 where a stitch bond can be made, the wire need not be broken. The bonding tool 13 after making the second bond 33 can continue to another spot and make another second bond (third bond) without forming the wire bonding tail 19 at bond 32. This dummy second bond is called a stitch bond because there is a fine wire interconnection between the two bonds. The wire bonding tail 19 is made in a direction which aligns it with the interconnection 31, thus, orienting the wire bonding tail 19 in the proper direction for the first bond on pad 28 without placing undue strain on the second bond 32.

Having explained how the wire bonding tail 19 is formed by bending the end of wire 10 under the working face 15 of a capillary wedge bonding tool 13, it will now be understood that ultrasonic fine wire bonding may be performed without the formal requirement of a rotary bonding tool head or a rotary chip supporting base. When programming the computer control automatic wire bonder, it is possible to take into account the size and shape of the conductive pads and conductive terminals so that the optimum orientation and direction of the wire bonding tail 19 is obtained. Most of the adjacent wire interconnections will not have an included angle greater than 60 degrees, however, when the exception does occur, it has been shown and described how the wire bonding tail 19 can be oriented in an optimum direction without placing undue strain on the second bond of the previous fine wire interconnection.

We claim:

1. A method of making uniform fine wire interconnections between conductive pads on a semiconductor device and conductive terminals on a substrate employing a capillary type bonding tool comprising:
    providing a fine wire in the capillary wedge bonding tool of the type having an annular working face with the end of the fine wire bent under the working face,
    making a first wire bond to attach said bent end of said fine wire to a first conductive pad on said semiconductor,
    moving said bonding tool away from said first conductive pad while paying out said fine wire to make a first fine wire loop interconnection between said first conductive pad and a first conductive terminal,
    clamping said fine wire relative to said bonding tool,
    making a second wire bond by attaching said fine wire to said first conductive terminal to provide a first fine wire interconnection between said conductive pad and said conductive terminal.
    determining the angular direction of said first fine wire interconnection,
    releasing said clamped fine wire,
    moving said capillary wedge bonding tool a short vertical and horizontal distance from said second bond to pay out a bent end of fine wire under the working face of said capillary wedge bonding tool,
    clamping said fine wire to prevent relative movement of said fine wire in said capillary bonding tool,
    determining the angular direction between the next conductive pad on said semiconductor device and the next conductive terminal on said substrate to be interconnected by said fine wire, and wherein the included angle between said first wire interconnection and said second fine wire interconnection is between 15 degrees and 60 degrees, and
    moving said capillary wedge bonding tool substantially horizontally away from said first and said second wire bonds along a path which is substantially equal to the determined angular direction between said next conductive pad and said next conductive terminal on said substrate to be interconnected by said fine wire to provide the end of said fine wire bent under said capillary bonding tool oriented in a proper angle direction for the next first wire bond on said next conductive pad.

2. A method of making uniform fine wire interconnections as set forth in claim 1 wherein said step of determining the angular direction between the next conductive pad and the next conductive terminal further includes,
    determining the angle which bisects the direction of said first fine wire interconnection and the angular direction of the next fine wire interconnection to be made, and
    the step of moving said bonding tool substantially away from said first and said second bond is along a path which is substantially equal to said angle which bisects the directions of said fine wire interconnections.

3. A method of making uniform fine wire interconnections as set forth in claim 1 wherein the included angle between said first fine wire interconnection and the next fine wire interconnection to be made is between 15 and 60 degrees and the proper angle of orientation of the end of said fine wire under said capillary bonding tool after being broken is less than said included angle by up to 15 degrees.

4. A method of making uniform fine wire interconnections between conductive pads on a semiconductor device and conductive terminals on a substrate employing a capillary type bonding tool comprising:
    providing a fine wire in the capillary wedge bonding tool of the type having an annular working face with the end of the fine wire bent under the working face,
    making a first wire bond to attach said bent end of said fine wire to a first conductive pad on said semiconductor,
    moving said bonding tool away from said first conductive pad while paying out said fine wire to make a first fine wire loop interconnection between said first conductive pad and a first conductive terminal,
    clamping said fine wire relative to said bonding tool,
    making a second wire bond by attaching said fine wire to said first conductive terminal to provide a first fine wire interconnection between said conductive pad and said conductive terminal,
    determining the angular direction of said first fine wire interconnection,
    releasing said clamped fine wire,
    moving said capillary wedge bonding tool a short vertical and horizontal distance from said second bond to pay out a bent end of fine wire under the working face of said capillary wedge bonding tool,
    clamping said fine wire to prevent relative movement of said fine wire in said capillary bonding tool,
    determining the angular direction between the next conductive pad on said semiconductor device and the next conductive terminal on said substrate to be interconnected by said fine wire, and wherein the included angle between said first wire interconnection and the next fine wire interconnection is greater than 60 degrees, and further includes the steps of:
    making said second bond and breaking said fine wire at an included angle up to 60 degrees,
    making a third dummy wire bond,
    moving said capillary bonding tool a short vertical and horizontal distance in the direction of said fine wire interconnection to provide a properly angled direction bent end of said fine wire bent under said capillary bonding tool,
    clamping said fine wire,
    moving said capillary bonding tool in a path which is substantially aligned with the direction of said next fine wire interconnection, and
    breaking said fine wire at said third dummy bond leaving the end of said fine wire bent and oriented in a proper direction for the next first bond.

* * * * *